(12) United States Patent
Hobbs et al.

(10) Patent No.: US 7,843,202 B2
(45) Date of Patent: Nov. 30, 2010

(54) APPARATUS FOR TESTING DEVICES

(75) Inventors: Eric D. Hobbs, Livermore, CA (US);
Nobuhiro Kawamata, Yokohama (JP);
Andrew W. McFarland, Dublin, CA
(US); Carl V. Reynolds, Pleasanton, CA
(US); Yoichi Urakawa, Yokohama (JP)

(73) Assignee: FormFactor, Inc., Livermore, CA (US)

( * ) Notice: Subject to any disclaimer, the term of this patent is extended or adjusted under 35 U.S.C. 154(b) by 95 days.

(21) Appl. No.: 11/864,690

(22) Filed: Sep. 28, 2007

(65) Prior Publication Data

US 2008/0186040 A1    Aug. 7, 2008

Related U.S. Application Data

(63) Continuation-in-part of application No. 11/306,270, filed on Dec. 21, 2005, now Pat. No. 7,498,825.

(51) Int. Cl.
*G01R 31/02* (2006.01)
(52) U.S. Cl. ........................ 324/754; 324/760
(58) Field of Classification Search ......... 324/754–765, 324/158.1; 439/66–72
See application file for complete search history.

(56) References Cited

U.S. PATENT DOCUMENTS

| | | | |
|---|---|---|---|
| 4,567,432 A * | 1/1986 | Buol et al. | 324/760 |
| 5,534,784 A * | 7/1996 | Lum et al. | 324/757 |
| 5,570,032 A * | 10/1996 | Atkins et al. | 324/760 |
| 6,081,110 A * | 6/2000 | Moore et al. | 324/158.1 |
| 6,300,780 B1 * | 10/2001 | Beaman et al. | 324/754 |
| 6,734,688 B1 * | 5/2004 | Castellano et al. | 324/754 |
| 6,888,362 B2 * | 5/2005 | Eldridge et al. | 324/757 |
| 6,891,385 B2 | 5/2005 | Miller | |
| 6,972,578 B2 | 12/2005 | Martens et al. | |
| 7,285,968 B2 | 10/2007 | Eldridge et al. | |
| 7,307,435 B2 * | 12/2007 | Mori | 324/754 |
| 2002/0118029 A1 * | 8/2002 | Yamasaka | 324/754 |
| 2004/0257098 A1 * | 12/2004 | Satou et al. | 324/754 |
| 2005/0275418 A1 * | 12/2005 | Chong et al. | 324/758 |
| 2007/0007977 A1 | 1/2007 | Eldridge et al. | |
| 2009/0206860 A1 | 8/2009 | McFarland et al. | |
| 2009/0230981 A1 | 9/2009 | Yasumura et al. | |

FOREIGN PATENT DOCUMENTS

| KR | 1020040022647 A | 3/2004 |
|---|---|---|
| KR | 1020070063824 A | 6/2007 |

OTHER PUBLICATIONS

International Search Report and Written Opinion mailed Apr. 6, 2009 for PCT Application No. PCT/US2008/078036.
Int'l Preliminary Report On Patentability, PCT Application No. US2008/078036 (Mar. 30, 2010), 5 pages.

* cited by examiner

*Primary Examiner*—Ha Tran T Nguyen
*Assistant Examiner*—Arleen M Vazquez
(74) *Attorney, Agent, or Firm*—Kirton & McConkie

(57) ABSTRACT

Methods and apparatus for testing semiconductor devices are provided herein. In some embodiments, an assembly for testing semiconductor devices can include a probe card assembly; and a thermal barrier disposed proximate an upper surface of the probe card assembly, the thermal barrier can restrict thermal transfer between tester side boundary conditions and portions of the probe card assembly disposed beneath the thermal barrier.

24 Claims, 5 Drawing Sheets

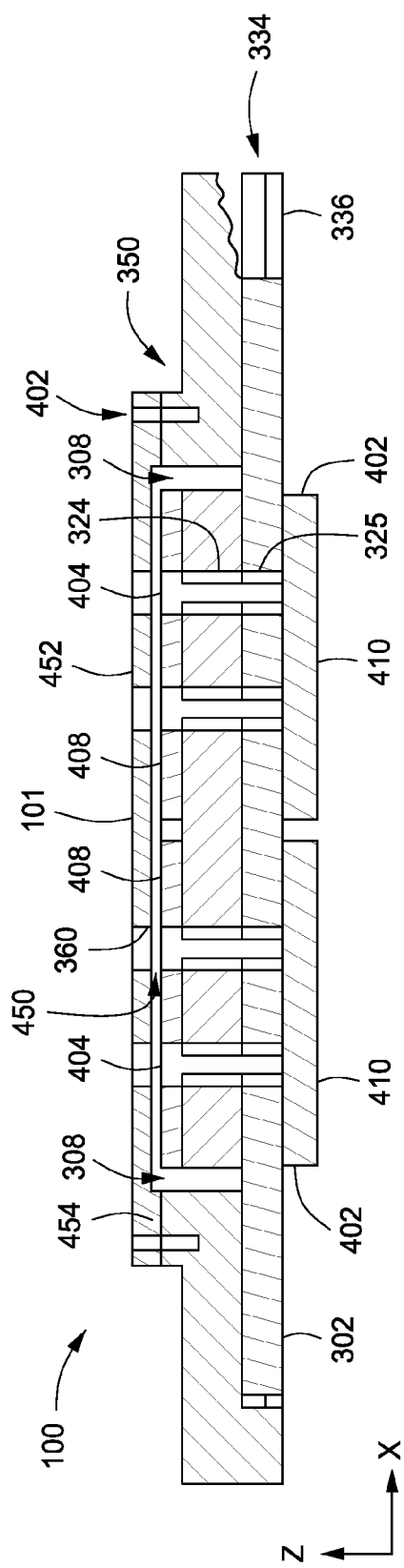
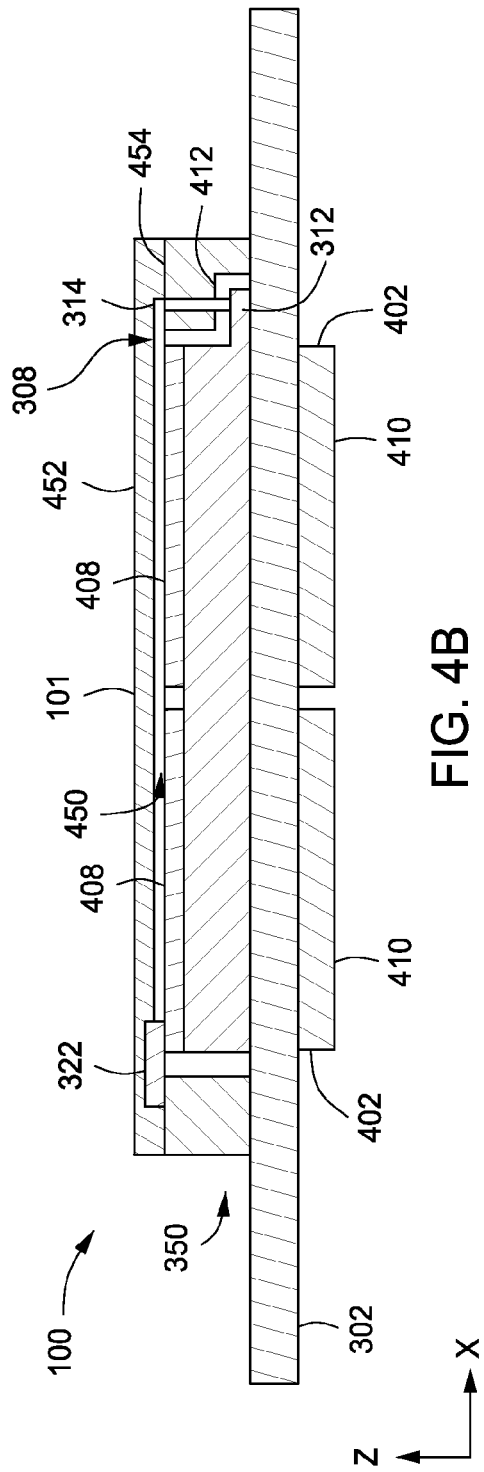
FIG. 4A
FIG. 4B

APPARATUS FOR TESTING DEVICES

CROSS-REFERENCE TO RELATED APPLICATIONS

This application is a continuation-in-part of U.S. patent application Ser. No. 11/306,270, filed Dec. 21, 2005 now U.S. Pat. No. 7,498,825, and entitled, "Probe Card Assembly With An Interchangeable Probe Insert."

BACKGROUND OF THE INVENTION

1. Field of the Invention

Embodiments of the present invention generally relate to semiconductor device test systems and, more specifically, to methods and apparatus for testing devices.

2. Description of the Related Art

When testing partially or fully completed semiconductor devices formed on a semiconductor substrate, such as integrated circuits and the like, a plurality of contact elements are typically brought into contact with the device to be tested—sometimes referred to as a device under test (or DUT). The contact elements are typically part of a probe card assembly or other similar device coupled to a test mechanism that provides electrical signals to terminals on the DUT in accordance with a predetermined testing protocol.

Such testing often can occur at high temperatures, for example up to about 150 degrees Celsius, which might require a preheat time for the probe card assembly to reach a steady state suitable to begin testing of the DUT. However, delays while waiting for the probe card assembly to heat up can be costly and reduce availability of the equipment for testing. Moreover, the probe card assembly may have a large mass (for example, due to stiffening members or assemblies for ensuring alignment of the probes extending from the probe card assembly), which further exacerbates this problem because a large mass takes longer to heat or cool.

In addition, in order to sufficiently and accurately contact all desired terminals of the DUT during a particular testing protocol, the contact elements disposed on the probe card assembly must be brought into contact with the terminals of the DUT and must maintain electrical connection therewith. However, variations in the temperature of components of the probe card assembly may induce forces that may cause the assembly (or components thereof) to deflect and/or move in a manner that may cause a misalignment of the contact elements sufficient to break electrical contact.

Accordingly, there is a need for an apparatus for testing semiconductor devices having increased thermal stability.

SUMMARY OF THE INVENTION

Methods and apparatus for testing semiconductor devices are provided herein. In some embodiments, an assembly for testing semiconductor devices can include a probe card assembly; and a thermal barrier disposed proximate an upper surface of the probe card assembly, the thermal barrier can restrict thermal transfer between tester side boundary conditions and portions of the probe card assembly disposed beneath the thermal barrier.

In some embodiments, an assembly for testing semiconductor devices can include a probe card assembly; and a cap disposed above an upper central surface of the probe card assembly, the cap providing a barrier between tester side boundary conditions and portions of the probe card assembly disposed beneath the cap.

In some embodiments, an assembly for testing semiconductor devices can include a probe card assembly having at least one wiring substrate for supporting and routing signals from a plurality of contact elements disposed beneath the wiring substrate to a tester; and a cap disposed above a central portion of the at least one wiring substrate, the cap can provide a barrier between tester side boundary conditions and portions of the probe card assembly disposed beneath the cap.

In some embodiments, a probe card assembly can include a wiring substrate having a tester side surface, an opposing wafer side surface, and a plurality of through holes extending therebetween; a support structure attached to the tester side surface of the wiring substrate and having portions extending into the through holes; a probe substrate located proximate to the wafer side surface of the wiring substrate and attached to the support structure; and a cap disposed on a first surface of the support structure, the cap can provide a barrier between tester side boundary conditions and portions of the probe card assembly disposed beneath the cap.

BRIEF DESCRIPTION OF THE DRAWINGS

So that the manner in which recited features of embodiments of the present invention can be understood in detail, a more particular description of the invention, briefly summarized above and others described below, may be had by reference to embodiments, some of which are illustrated in the appended drawings. It is to be noted, however, that the appended drawings illustrate only typical embodiments of this invention and are, therefore, not to be considered limiting of its scope, for the invention may admit to other equally effective embodiments.

FIG. 4A depicts a schematic side view of the probe card assembly of FIG. 3 shown in cutaway corresponding to section lines 4A of FIG. 3.

FIG. 4B depicts a schematic side view of the probe card assembly of FIG. 3 shown in cutaway corresponding to section lines 4B of FIG. 3.

Where possible, identical reference numerals are used herein to designate identical elements that are common to the figures. The images used in the drawings are simplified for illustrative purposes and are not necessarily depicted to scale.

DETAILED DESCRIPTION

The present invention provides embodiments of probe card assemblies having thermal barriers that limit or significantly reduce the effects of boundary conditions present on the tester side of the probe card assembly during use in a test system. Methods of use of the probe card assembly are further provided. The probe card assembly can reduce heat loss or gain from the probe card assembly components due to tester side boundary conditions, thereby reducing heating or cooling times required to bring the probe card assembly to a desired operational temperature and reducing probe card assembly heat loss or gain during use as well as providing greater consistency in use of a probe card assembly within varying testers.

The figures and following description provided herein illustratively refer to an exemplary Cartesian coordinate system where the x and y axes are substantially parallel to a plane defined by a stiffener assembly and/or probe card assembly incorporating same, and wherein the z axis is substantially normal, or perpendicular, to such a plane. For example, FIGS. 3A-B illustratively depict top views of a probe card assembly in an x-y plane, where the z axis would extend perpendicularly into and out of the page. FIGS. 1, 2, and 4A-B illustratively depict side views of a test system and probe card assemblies in an x-z plane.

Figure 1:
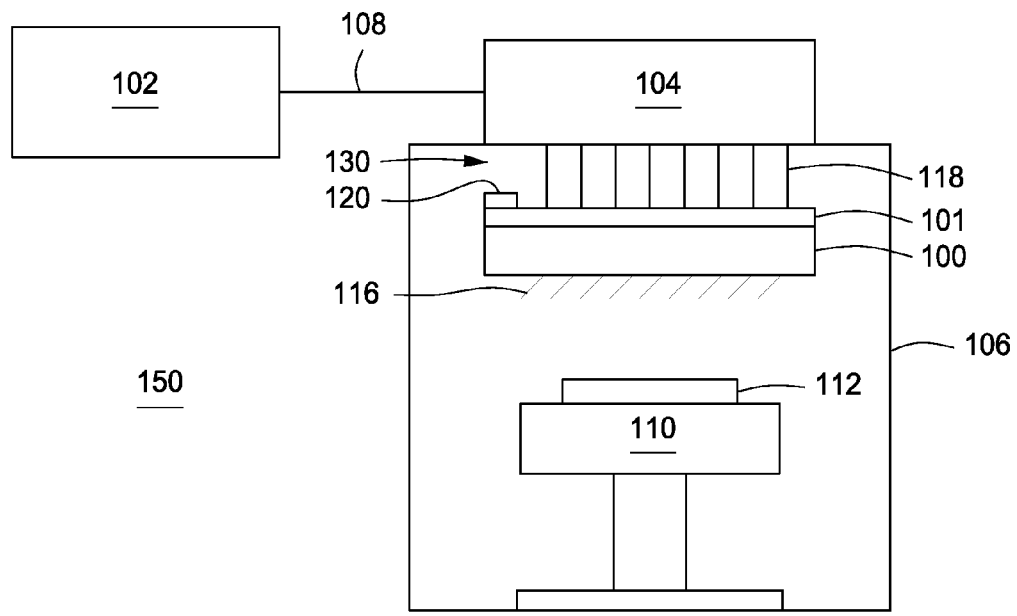
FIG. 1 is a block diagram depicting a test system utilizing a probe card assembly having an upper thermal barrier according to some embodiments of the present invention.

FIG. 1 is a block diagram depicting a test system 150 according to some embodiments of the invention. The test system 150 can generally include a test system controller 102, test instruments 104, and a prober 106. The test system controller 102 can be coupled to the test instruments 104 by a communication link 108. The prober 106 can include a stage 110 for mounting a device under test (DUT) 112 being tested and a probe card assembly 100. The DUT 112 can be any electronic device or devices to be tested. Non-limiting examples of a suitable DUT include one or more dies of an unsingulated semiconductor wafer, one or more semiconductor dies singulated from a wafer (packaged or unpackaged), an array of singulated semiconductor dies disposed in a carrier or other holding device, one or more multi-die electronics modules, one or more printed circuit boards, or any other type of electronic device or devices. The term DUT, as used herein, refers to one or a plurality of such electronic devices. The probe card assembly 100 includes resilient contact elements 116 that contact the DUT 112. The stage 110 can be movable to selectively make contact between the DUT 112 and the resilient contact elements 116.

In the test system 150, test data can be generated by the test instruments 104 and transmitted through the probe card assembly 100, the resilient contact elements 116, and ultimately to the DUT 112. The generation of the test data may be controlled by the test system controller 102 (e.g., a general purpose computer). Test results can then provided from the DUT 112 back through the probe card assembly 100 to the test instruments 104. The test instruments 104 may transmit the test results to the test system controller 102 for analysis.

Test data provided from the test instruments 104 can be divided into individual test channels. The test channels can be linked by connectors 118 to the probe card assembly 100. The connectors 118 may be any suitable connectors, such as flexible cable connectors, pogo pins, zero insertion force (ZIF) connectors, or the like. The probe card assembly 100 can fan out each of the test channels to multiple resilient contact elements 116. The probe card assembly 100 may include electronics 120 for enabling the fan outs and for isolating faults on the fan out lines.

Testing performed in the test system 150 may be carried out at elevated temperatures. For example, the DUT 112 can be tested at an elevated temperature (for example, up to 250 degrees Celsius for wafer level burn-in). The probe card assembly 100 can be preheated to a temperature equal to or within a given tolerance of the testing temperature, or to a steady state temperature. The preheat, or soak, period can be undesirably lengthy, as it reduces the availability of the test system while waiting for the probe card assembly 100 to come to temperature. Moreover, changes in temperature of the probe card assembly during testing may cause the resilient contact elements 116 to lose contact with one or more terminals of the DUT 112 due to thermally induced movement of the resilient contact elements 116.

In addition, thermal effects due to the boundary conditions of the test system 150 may exacerbate the above problems. For example, boundary conditions such as temperature variations, wind currents, physical contact with or proximity to other components having different temperatures, or other conductive, convective, or radiant heat sources and/or sinks in proximity to the probe card assembly 100 may undesirably cause delay in bringing the probe card assembly 100 up to the desired temperature, uneven temperature distribution of the probe card assembly 100, change in the temperature or temperature distribution of the probe card assembly 100 during testing, or the like.

In some testing applications, thermal effects due to tester side boundary conditions 130 (e.g., boundary conditions on the tester side of the probe card assembly 100) have been discovered to particularly exacerbate the above problems when, for example, tester side boundary conditions 130 include large temperature differences from the desired temperature of a probe card assembly in a particular application. The tester side boundary conditions 130 are defined with respect to the probe card assembly 100. For example, using the probe card assembly 100 as a reference, the tester side boundary conditions 130 are the boundary conditions present in the test system 150 above the probe card assembly 100.

Accordingly, in some embodiments, a thermal barrier 101 may be disposed between the probe card assembly 100 and an upper region of the test system 150 to insulate the probe card assembly 100 from the effects of the tester side boundary conditions 130. The thermal barrier 101 may disposed proximate an upper surface of the probe card and assembly 100 and may be part of the probe card assembly 100 or may be coupled thereto. Alternatively, the thermal barrier 101 may be disposed within the test system 150 and supported in a desired position above the probe card assembly 100.

Figure 2:
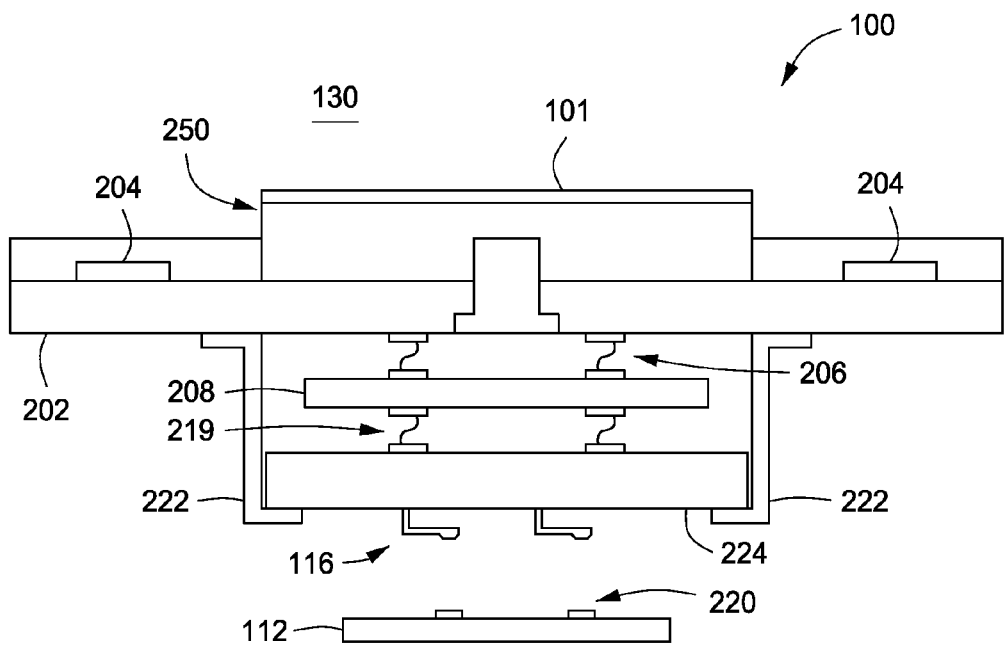
FIG. 2 depicts a schematic side view of a probe card assembly having an upper thermal barrier according to some embodiments of the present invention.
Figure 3A:
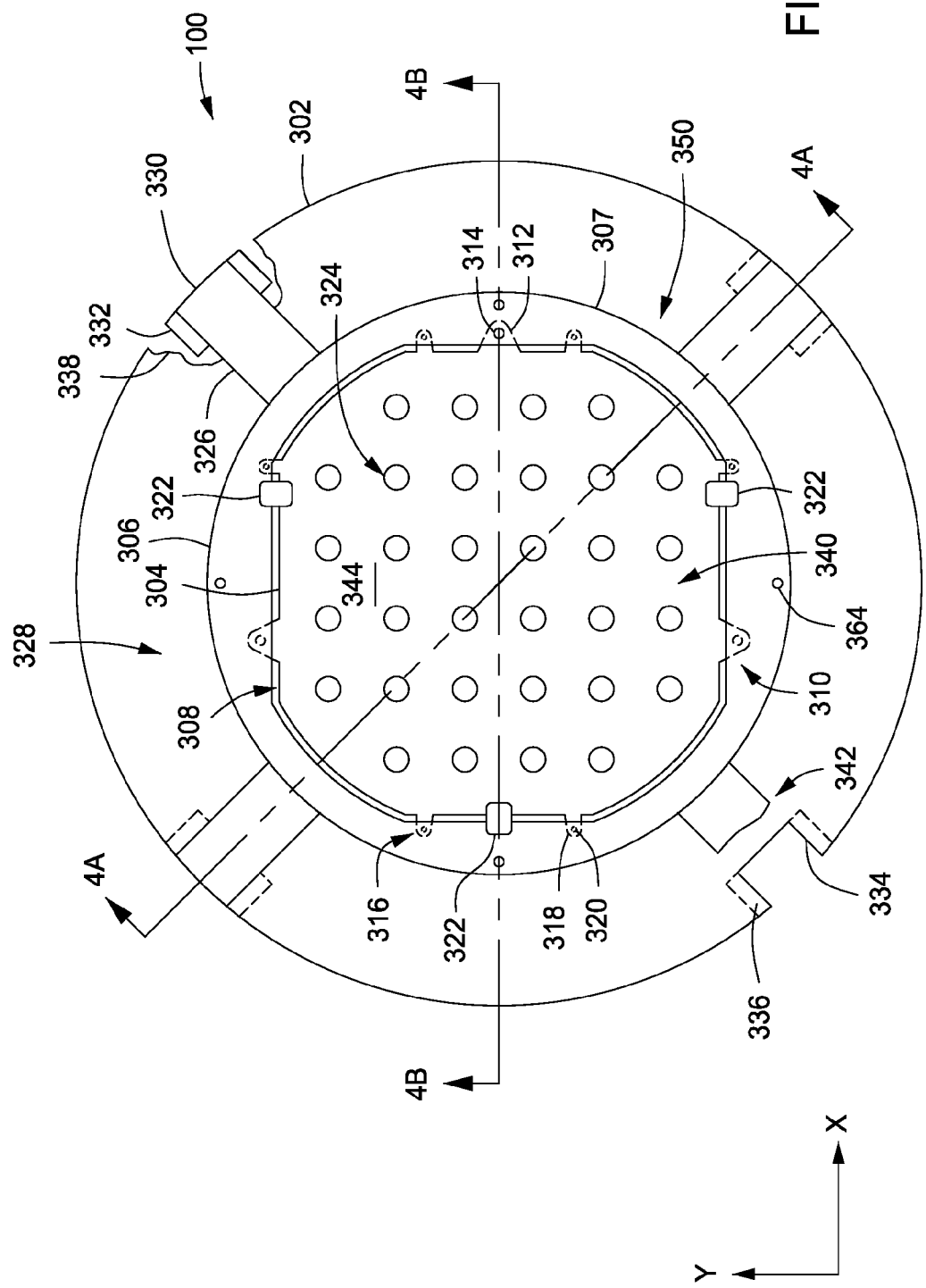
FIG. 3A depicts a schematic top view of a probe card assembly having an upper thermal barrier (with the thermal barrier removed for illustration) according to some embodiments of the present invention.
Figure 3B:
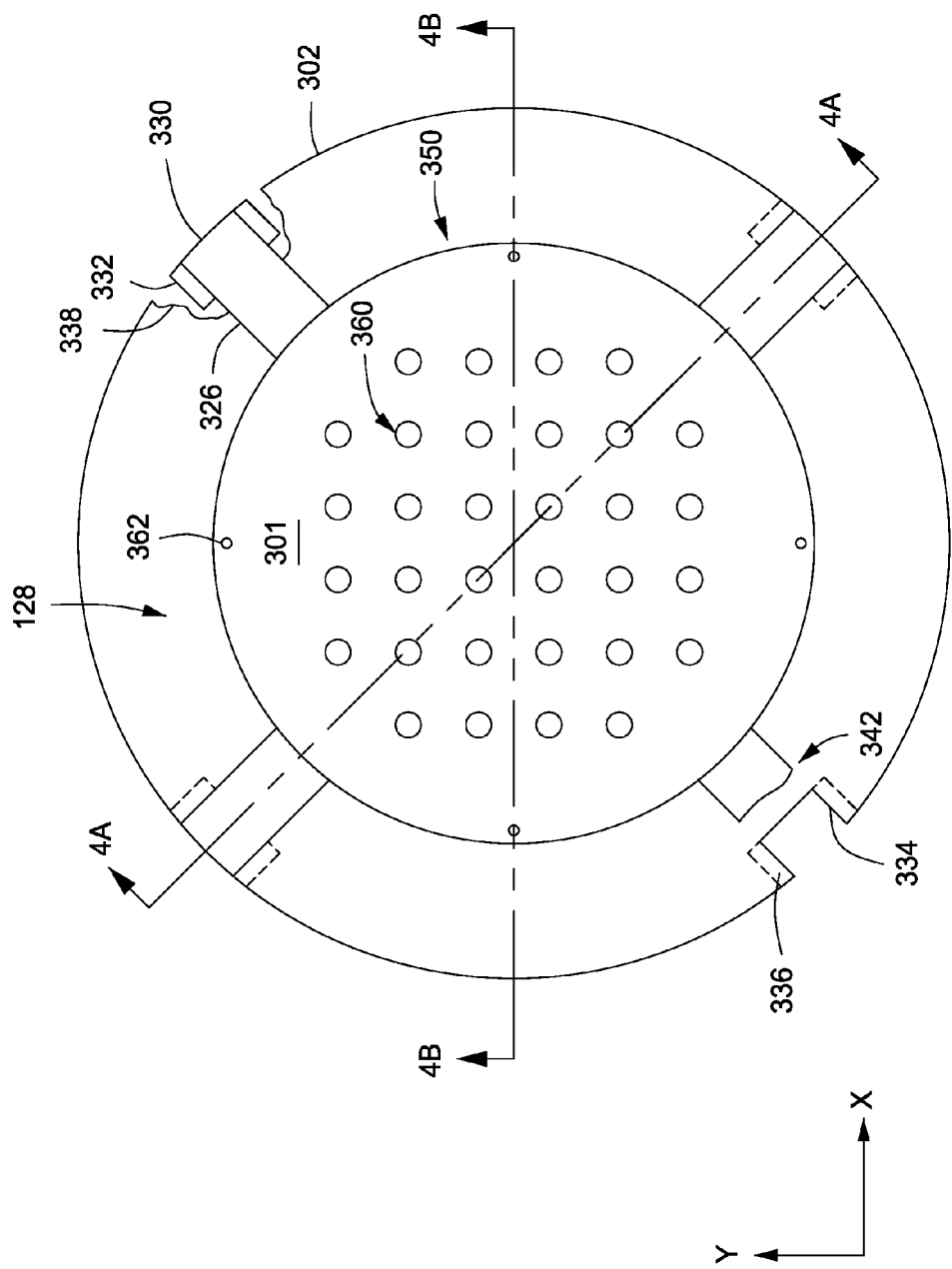
FIG. 3B depicts a schematic top view of a probe card assembly having an upper thermal barrier according to some embodiments of the present invention.

For example, FIG. 2 schematically depicts a side view of an illustrative probe card assembly 100 having a thermal barrier 101 according to some embodiments of the present invention. The exemplary probe card assembly 100 illustrated in FIG. 2 can be used to test one or more electronic devices (represented by DUT 112), for example, in a test system similar to the test system 150 described above with respect to FIG. 1.

As discussed above, the probe card assembly 100 can act as an interface between a tester (for example, as shown in FIG. 1) and the DUT 112. Accordingly, the thermal barrier 101 may be disposed in an upper region of the probe card assembly 100, such as on an upper surface thereof, thereby being interposed between the probe card assembly 100 and the tester side boundary conditions 130. In some embodiments, the thermal barrier 101 may be disposed on an upper central surface of the probe card assembly 100 (e.g., resting on, mounted on, or otherwise coupled to the probe card assembly 100).

The probe card assembly 100 can include electrical connectors 204 configured to make electrical connections with a plurality of communications channels (not shown) from the tester. The probe card assembly 100 can also include one or more resilient contact elements 166 configured to be pressed against, and thus make temporary electrical pressure connections with, one or more input and/or output terminals 220 of DUT 112. The resilient contact elements 116 can be configured to correspond to the terminals 220 of the DUT 112 and may be arranged in one or more arrays having a desired geometry.

The probe card assembly 100 may include one or more substrates configured to support the connectors 204 and the resilient contact elements 116 and to provide electrical connections therebetween. The exemplary probe card assembly 100 shown in FIG. 2 has three such substrates, although in other implementations, the probe card assembly 100 can have more or fewer substrates. In the embodiment depicted in FIG. 2, the probe card assembly 100 includes a wiring substrate 202, an interposer substrate 208, and a probe substrate 224. The wiring substrate 202, the interposer substrate 208, and the probe substrate 224 can be made of any type of suitable material or materials, such as, without limitation, printed circuit boards, ceramics, organic or inorganic materials, and the like, or combinations thereof.

As shown in FIG. 2, a support structure, such as a stiffener assembly 250, may be coupled to the wiring substrate 202. The stiffener assembly 250 may be utilized, as described in more detail below, to support the wiring substrate 202 and facilitate maintaining the respective tips of the resilient contact elements 116 in a configuration, or topography, that lies within a pre-defined tolerance of a corresponding topography of the respective top surfaces of the terminals 220 of the DUT 112. In some embodiments the tolerance is within 30 microns. In some embodiments, the topography is substantially planar. In some embodiments, the topography may be non-planar. In the embodiment shown in FIG. 2, the thermal barrier 101 may be coupled to an upper surface of the stiffener assembly 250. It is contemplated that the thermal barrier 101 may alternatively be coupled to other components of the probe card assembly 100, or may supported in a desired position with respect to the probe card assembly 100 (e.g., between the probe card assembly 100 and the tester side boundary conditions 130).

Electrically conductive paths (not shown) are typically provided from the connectors 204 through the various substrates to the resilient contact elements 116. For example, in the embodiment depicted in FIG. 2, electrically conductive paths (not shown) may be provided from the connectors 204 through the wiring substrate 202 to a plurality of electrically conductive spring interconnect structures 206. Other electrically conductive paths (not shown) may be provided from the spring interconnect structures 206 through the interposer substrate 208 to a plurality of electrically conductive spring interconnect structures 219. Still other electrically conductive paths (not shown) may further be provided from the spring interconnect structures 219 through the probe substrate 224 to the resilient contact elements 116. The electrically conductive paths through the wiring substrate 202, the interposer substrate 208, and the probe substrate 224 can comprise electrically conductive vias, traces, or the like, that may be disposed on, within, and/or through the wiring substrate 202, the interposer substrate 208, and the probe substrate 224.

The wiring substrate 202, the interposer substrate 208, and the probe substrate 224 may be held together by one or more brackets 222 and/or other suitable means (such as by bolts, screws, or other suitable fasteners). The configuration of the probe card assembly 100 shown in FIG. 2 is exemplary only and is simplified for ease of illustration and discussion and many variations, modifications, and additions are contemplated. For example, a probe card assembly may have fewer or more substrates (e.g., 202, 208, 224) than the probe card assembly 100 shown in FIG. 2. As another example, a probe card assembly may have more than one probe substrate (e.g., 224), and each such probe substrate may be independently adjustable (as described above with respect to FIGS. 1-2). Other non-limiting examples of probe card assemblies with multiple probe substrates are disclosed in U.S. patent application Ser. No. 11/165,833, filed Jun. 24, 2005. Additional non-limiting examples of probe card assemblies are illustrated in U.S. Pat. No. 5,974,662, issued Nov. 2, 1999 and U.S. Pat. No. 6,509,751, issued Jan. 21, 2003, as well as in the aforementioned U.S. patent application Ser. No. 11/165,833. It is contemplated that various features of the probe card assemblies described in those patents and application may be implemented in the probe card assembly 100 shown in FIG. 2 and that the probe card assemblies described in the aforementioned patents and application may benefit from the use of the inventive stiffener assembly disclosed herein.

In operation, the probe card assembly may be preheated to a desired elevated temperature, for example, by a heater disposed in the stage 110 (shown in FIG. 1), or by other heating mechanisms. The thermal barrier 101 may advantageously facilitate reducing preheat times by reducing the heat transfer from the probe card assembly 100 to the upper region of the tester. Moreover, the thermal barrier 101 may advantageously restrict, or limit, the exposure of the probe card assembly 100 to tester side boundary conditions 130 that would otherwise undesirably increase preheat times (or cause other issues as discussed above).

Positioning mechanisms associated with the stiffener assembly 250 may be adjusted, as described in more detail below, to alter a planar and/or lateral orientation of the probe substrates 224 and/or resilient contact elements 116 disposed thereon during an initial assembly of the probe card assembly 100 as well as, if desired, after the installation of the stiffener assembly 250 in a particular testing apparatus (e.g., to compensate for planarity and/or lateral positional variations in particular probers/testers being utilized and/or particular DUTs being tested), or after preheating the probe card assembly 100.

Next, the resilient contact elements 116 may be brought into contact with the terminals 220 of the DUT 112 by moving at least one of the DUT 112 or the probe card assembly 100. The stage 110 depicted in FIG. 1 can be movable, such that it may move the DUT 112 into sufficient contact with the resilient contact elements 116 to provide reliable electrical contact with the terminals 220. The DUT 112 can then tested per a pre-determined protocol as contained in the memory of the tester. For example, the tester may generate power and test signals that are provided through the probe card assembly 100 to the DUT 112. Response signals generated by the DUT 112 in response to the test signals can be similarly carried through the probe card assembly 100 to the tester, which may then analyze the response signals and determine whether the DUT 112 responded correctly to the test signals.

When moving the DUT 112 to contact the resilient contact elements 116 of the probe card assembly 100, the DUT 112 typically continues to move towards the probe card assembly 100 until all of the resilient contact elements 116 come into sufficient contact with the terminals 220. Due to one or both of the non-planarity of the respective tips of the resilient contact elements 116 disposed on the probe card assembly 100 and the variations of the heights of the terminals 220, the DUT 112 may continue to move towards the probe card assembly 100 for an additional non-limiting exemplary range of about 1-4 mils (about 25.4-102 µm) after the initial contact of the first resilient contact element 226 to contact the DUT 112 (sometimes referred to as overtravel). The actual amount of overtravel depends on the characteristics of the non-planarity of the respective tips of the resilient contact elements 116 and/or the variations in height of the terminals 220.

Accordingly, some of the resilient contact elements 116 may undergo more deflection than others. Thus, the overtravel requirement imparts forces to the probe substrate 224 that are transferred to the wiring substrate 202.

The stiffener assembly 250 can facilitate restricting any deflection of the wiring substrate 202 that may undesirably cause the positions of the tips of the contact elements 116 to move and possibly lose contact with the terminals 220 of the DUT 112. However, changes in the thermal profile of the of the stiffener assembly 250, or other components of the probe card assembly 100, may undesirably cause movement of the resilient contact elements 116 to a sufficient degree to break reliable contact with the one or more terminals 220 of the DUT 112. The thermal barrier 101, by restricting the exposure of the probe card assembly 100 to tester side boundary conditions 130, can reduce the risk and/or severity of any such temperature profile changes.

Figure 5:
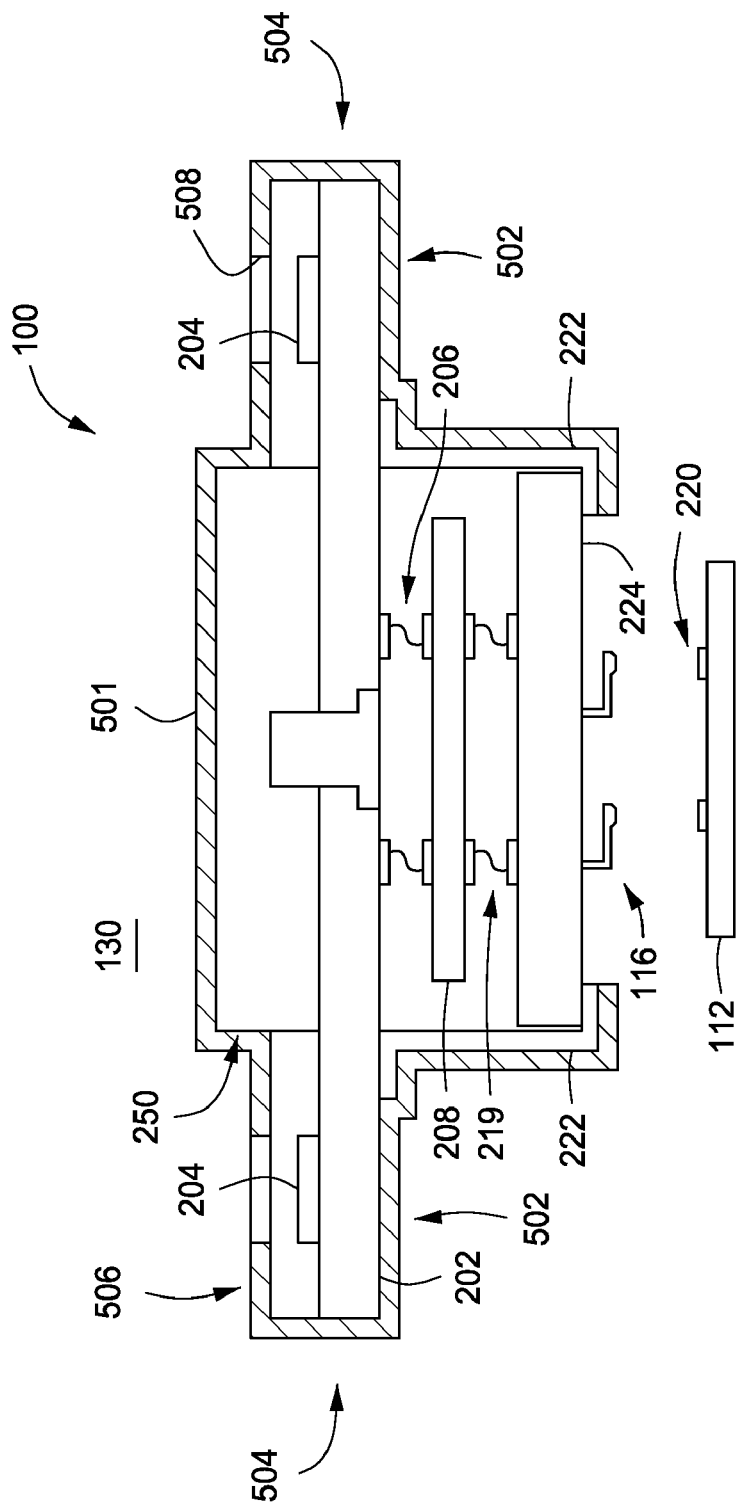
FIG. 5 depicts a schematic side view of a probe card assembly having a thermal barrier (shown in cross section) according to some embodiments of the present invention.

Although illustratively shown as covering only an upper portion of the probe card assembly in FIG. 2, it is contemplated that the thermal barrier may be sized and configured to cover any desired portions of the probe card assembly. For example, in some embodiments, and as depicted in FIG. 5, a thermal barrier 501 may be provided. The thermal barrier 501 may be similar in any respect to the thermal barrier 101 as described herein, with the exception of the coverage of the probe card assembly. For example, in some embodiments, and as shown in FIG. 5, the thermal barrier 501 may be sized to cover the entire probe card assembly 100 with the exception of a lower portion sufficient to facilitate contact of the terminals 220 of the DUT 112 with the resilient contact elements 116. In some embodiments, the thermal barrier 501 may be configured to wrap around the probe card assembly 100 from an upper surface 506 to at least a portion of the underside 502 of the probe card assembly 100, or to the sides 504 of the probe card assembly 100. In some embodiments, the thermal barrier 501 may be configured to cover the entire upper surface 506 of the probe card assembly 100. In some embodiments, the thermal barrier 501 may be configured to cover only the underside 502, or the underside 502 and sides 504, of the probe card assembly 100, the with the exception of a lower portion sufficient to facilitate contact of the terminals 220 of the DUT 112 with the resilient contact elements 116.

In embodiments where the thermal barrier 501 covers, or is disposed adjacent to, portions of the probe card assembly where connections are desired to be made for routing electrical signals (such as at electrical connectors 204), the signals may be routed to go around the thermal barrier 501 or the thermal barrier 501 may be configured to allow the signals to be routed therethrough. For example, in some embodiments, one or more openings 508 may be provided in the thermal barrier 501 to facilitate routing wires or other conductive elements therethrough. In some embodiments, one or more electrical connectors or conductive paths 510 may be provided through the thermal barrier to facilitate making electrical connections between, for example, the electrical connectors 204 and the communications channels of the tester (as discussed above with respect to FIG. 2).

FIGS. 3A-B depict top views of a stiffener assembly 350 having a thermal barrier 301 according to some embodiments of the present invention. FIG. 3A depicts the stiffener assembly 350 with a thermal barrier 301 removed for illustrative purposes. FIG. 3B depicts the stiffener assembly 350 with the thermal barrier 301 in place according to some embodiments of the present invention. The stiffener assembly 350 and the thermal barrier 301 may be similar to the stiffener assembly 250 and the thermal barrier 101, respectively, described above with respect to FIGS. 1-2 (and vice versa) and are illustratively shown coupled to a substrate 302 to demonstrate an illustrative use of the stiffener assembly 350 and the thermal barrier 301. The stiffener assembly 350 and thermal barrier 301 are further explained with reference to FIGS. 4A-B, respectively depicting schematic side views of the stiffener assembly 350 and thermal barrier 301 as illustratively used in a probe card assembly according to some embodiments of the present invention. FIGS. 4A-B are shown in cutaways respectively corresponding to section lines 4A-4A and 4B-4B of the stiffener assembly 350 and thermal barrier 301 shown in FIGS. 3A-B.

The thermal barrier 301 can be interposed between the probe card assembly and the tester side of the test system. Accordingly, the thermal barrier 301 can be disposed in an upper region of the probe card assembly, or may be held in place above the probe card substrate. In some embodiments, and as best shown in FIG. 3B, the thermal barrier 301 may be disposed atop of, or coupled to, the stiffener assembly 350 of the probe card assembly 100. As such, in some embodiments, the thermal barrier 301 is a cap of the stiffener assembly 350, or of the probe card assembly 100. The thermal barrier 301 may be fixedly or movably coupled to the stiffener assembly 350 (or other component of the probe card assembly or test system) by any suitable mechanism, such as fasteners, clamps, locating pins, or the like. For example, the thermal barrier may have a plurality of holes (such as four holes 362 shown in FIG. 3B) for coupling or locating the thermal barrier 301 atop the stiffener assembly 350 (such as by screws, pins, or the like).

The thermal barrier 301 may be a passive thermal barrier. For example, the thermal barrier 301 may comprise a member or plate that is sized and shaped to cover at least a portion of the probe card assembly as desired to restrict or reduce the effects of tester side boundary conditions present during use in a test system. The thermal barrier 301 may be monolithic, or may comprise a plurality of layers or segments. The thermal barrier 301 may be fabricated of any suitable materials having a low thermal conductivity, such as plastics, ceramics, or the like. Although the thermal barrier 301 is shown disposed atop the stiffener assembly 350 (and atop the probe card assembly), in some embodiments, additional components of the probe card assembly may be disposed above the thermal barrier 301.

In some embodiments, and as best shown in FIG. 3A, the stiffener assembly 350 may include an inner member 304 and an outer member 306. Alternatively, the stiffener assembly 350 may comprise singular members or other configurations of members. The inner member 304 may comprise a body 344 that, in some embodiments, can generally have a size and shape corresponding to one or more probe substrates (such as probe substrates 402 shown in FIGS. 4A-B) disposed beneath the substrate 302. The inner member 304 in some instances may rest directly against the substrate 302. Alternatively, additional layers (not shown) may be disposed between the inner member 104 and the substrate 302. In some embodiments, one or more locating pins (not shown) may be provided to facilitate alignment of the inner member 304 and the substrate 302.

The inner member 304 may comprise any materials suitable to maintain acceptable rigidity of a probe card assembly (as discussed above with respect to FIG. 2) when subjected to forces utilized in testing (such as forces used to pre-load the stiffener assembly and/or probe card assembly, forces applied due to varying energy flows through the stiffener assembly and/or probe card assembly (such as heating the substrate, electrical flows, or the like), forces applied to make sufficient electrical contact with the terminals of a DUT, or the like) and to closely match the thermal strain between the stiffener assembly 350 and the substrate 302 to mitigate shear coupling therebetween. Non-limiting examples of suitable materials include metals and metal alloys such as Kovar®, Invar®, steel, stainless steels, or the like. The materials comprising the inner member 304 may further be selected to facilitate a desired rate of heat transfer, or a desired heat capacity for the inner member 304.

In some embodiments, as shown in FIG. 4A, a probe substrate alignment mechanism may be provided to locally adjust both the lateral and the planar alignment of probe substrates 402 disposed beneath the inner member 304. Accordingly, a plurality of openings 324 may be formed through the body 350 of the inner member 304, and a corresponding plurality of openings 360 may be disposed through the thermal barrier 301, to facilitate such planar alignment of the probe substrates 402. The openings 360 in the thermal barrier 301 may be configured to not substantially denigrate the functionality of the thermal barrier 301 (e.g., the probe card assembly may remain substantially shielded from the tester side boundary conditions.) In some embodiments, the thermal barrier 301 may be provided without the opening 360, in which case the thermal barrier 301 may be installed after any alignment adjustments are made, or alternative mechanisms may be provided to align the probe substrates 402 without needing access through the thermal barrier 301.

In some embodiments, the probe substrate alignment mechanism may comprise one or more adjuster plates 408 disposed above the inner member 304. Each adjuster plate 408 may be coupled to respective pluralities of planar alignment mechanisms 404 that interface with the probe substrates 402. In some embodiments, the alignment mechanism 404 may be a screw. However, the alignment mechanism 404 may comprise other devices suitable for selectively adjusting planarity of the probe substrates 402. Each planar alignment mechanism 404 passes through a respective opening 324 in the inner member 304 and a corresponding opening 325 in the substrate 302. The openings 324, 325 may have a larger diameter than the planar alignment mechanisms 404 to facilitate lateral movement thereof with respect to the inner member 304 and the substrate 302.

In operation, the adjuster plates 408 may be laterally positioned to control the respective lateral positions of contact elements formed on respective probe surfaces 410 of the probe substrates 402 with respect to the inner member 304 and the substrate 302. Once in a desired position, the adjuster plates 408 may be locked into position, for example, by clamping, bolting, or otherwise securing the adjuster plates 408 to the inner member 304. The planar alignment mechanisms 404 may be individually adjusted to selectively control the planarity of the probe substrates 402 before or after lateral alignment of the probe substrates 402, or both.

In some embodiments, and as shown in FIGS. 4A-B, the thermal cap 101 may be configured to maintain an air space, or gap 450, between a body 452 of the thermal cap 101 and the probe card assembly 100. The gap 450 facilitates an insulative region between the probe card assembly 100 (and/or components thereof) and the thermal barrier 101 due to the lower rate of thermal conductivity through air or other gases present within the gap 450 as compared to direct contact between the components, thereby further restricting, or limiting, the influence of tester side boundary conditions on the probe card assembly 100. The gap 450 may be provided by any suitable means, such as use of a spacer disposed between the thermal barrier 101 and the probe card assembly 100, by providing a boss, standoff, of other feature on one or more of the thermal barrier 101 or the probe card assembly (or components thereof), or by securing the thermal barrier to some other component in the tester environment that maintains the thermal barrier in a desired position. In some embodiments, and as shown in FIGS. 4A-B, the body 450 may have a boss 454 disposed proximate a peripheral portion of the thermal barrier 101 to provide the gap 450.

Returning to FIG. 3A, the outer member 306 generally comprises a body 307 having a central opening 340. The size and shape of the opening 340 can generally correspond to the size and shape of the inner member 304, such that the outer member 106 substantially circumscribes, or surrounds, the inner member 304.

The outer member 306 may be fixedly coupled to the substrate 302 by any suitable mechanism, such as, screws, bolts, clamps, or the like. Alternatively, the outer member 306 may be movably coupled to the substrate 302, such that the substrate 302 is free to expand and contract (e.g., laterally) with respect to the stiffener assembly 350. In some embodiments where the thermal barrier 301 is coupled to the stiffener assembly 350, the outer member 306 may have a plurality of openings 364 to facilitate coupling with the thermal barrier 301. For example, the openings 364 may be tapped to receive a plurality of screws, or may be sized to fit locating pins therein, or the like. In the embodiment shown in FIGS. 3A-B, the thermal barrier 301 has a plurality of openings 362 (as shown in FIG. 3B) corresponding to the openings 364 of the outer member 306 (as shown in FIG. 3A) to facilitate bolting the thermal barrier 301 to the outer member 306. Alternatively or in combination, the thermal barrier 301 may also be coupled to the inner member 304 or other components of the stiffener assembly 350, the probe card assembly 100, or the test system.

In some embodiments, a plurality of arms 326 may extend outwardly from the body 307 of the outer member 306 to facilitate stiffening regions 328 of the substrate 302 that are disposed radially outwards of the body 307. The outwardly extending arms 326 may be formed integrally with the body 307 or may be affixed thereto in any suitable manner able to withstand the forces generated during use. In the embodiment depicted in FIG. 3A, four such outwardly extending arms 326 are depicted. It is contemplated that greater or fewer arms 326 may be provided. In some embodiments, the outer member 306 can be mechanically coupled to a tester (not shown), e.g., via a plurality of the arms 326.

The outwardly extending arms 326 may facilitate stiffening of the substrate 302 to restrict non-planar deflection thereof, while at the same time facilitating lateral movement between the stiffener assembly 350 and the substrate 302. For example, in some embodiments, each arm 326 may further include an extension 330 having a flange 332 extending therefrom (shown through illustrative cutaway 338 in the substrate 302) designed to interface with a slot 334 and corresponding shelf 336 formed in the substrate 302 (revealed via illustrative cutaway 342). Interference between the flange 332 and the shelf 336 restricts deflection of the substrate 302, thereby providing added stability and/or rigidity to the substrate 302 in the regions 128 disposed radially outwards of the body 307 of the outer member 306. However, co-planar, lateral (e.g., radial) movement of the stiffener assembly 350 with respect to the substrate 302 may still occur due to slippage between the flange 332 and the shelf 336.

In some embodiments—for example, to facilitate construction of the stiffener assembly 350 with a substrate as used in a probe card assembly—the outwardly extending arms 326 and the extensions 330 may be separate components that may be suitably coupled together. Accordingly, one or more mechanisms, such as a screw, may be utilized to couple the outwardly extending arms 326 to the respective extensions 330. For example, in some embodiments, on or more holes (not shown) may be provided in the outwardly extending arms 326 with corresponding holes (not shown) provided in the extension 330 to facilitate using screws (not shown) to couple the outwardly extending arms 326 to the extensions 330. In some embodiments, the dimensions of the extension 330 and flange 332 relative to the slot 334 and shelf 336 formed in the substrate 302 may be selected to facilitate slideable coupling therebetween, thereby allowing lateral movement between the outwardly extending arms 326 and the substrate 302.

The outer member 306 may comprise any materials suitable to maintain acceptable rigidity of a probe card assembly (as discussed above with respect to FIG. 2) when subjected to forces utilized in testing (such as forces used to pre-load the stiffener assembly and/or probe card assembly, applied due to varying energy flows through the stiffener assembly and/or probe card assembly (including heating), applied to make sufficient electrical contact with the terminals of a DUT, or the like) and to closely match the thermal strain between the stiffener assembly 350 and the substrate 302 to mitigate shear coupling therebetween. Non-limiting examples of suitable materials include metals and metal alloys such as Kovar®, Invar®, steel, stainless steels, metal matrix composites, ceramics, cermets, or the like. The materials comprising the outer member 104 may further be selected to facilitate a desired rate of heat transfer, or a desired heat capacity for the inner member 304.

The inner and outer members 304, 306 may comprise the same or different materials. Moreover, the materials comprising the inner and outer members 304, 306 may advantageously be selected to provide similar or different thermal characteristics to the inner and outer members 304, 306. For example, in some embodiments, the inner member 304 may have a low heat capacity and/or a high heat transfer rate to facilitate rapid heating of the inner member 304 to process temperatures during testing. In some embodiments, the outer member 306 may have a high heat capacity and/or a low heat transfer rate to facilitate preventing heat from flowing out of the inner member 304 through the outer member 306. It is contemplated that the thermal characteristics of the inner and outer members 304, 306 may be reversed from the above description depending upon the specific application.

A gap 308 may be maintained between the inner and outer members 304, 306, such that the members are disposed in a predominantly spaced apart relation with respect to each other. The gap 308 can restrict conductive heat transfer between the inner and outer members 304, 306, thereby facilitating greater control over the desired thermal characteristics of the stiffener assembly 350.

A plurality of alignment mechanisms 310 may be provided for orienting the inner and outer members 304, 306 with respect to each other. In the embodiment depicted in FIG. 3, three such alignment mechanisms 310 are shown. It is contemplated that greater or fewer alignment mechanisms may be provided. Each alignment mechanism 310 may be additionally utilized to transfer forces applied to a lower surface of the inner member 304 to the outer member 306 (for example, when contacting a DUT with contact elements of the probe substrate). Furthermore, the plurality of alignment mechanisms 310 may provide the predominant conductive heat transfer passageway between the inner and outer members 304, 306 due to the maintenance of the gap 308 therebetween. By utilizing such alignment mechanisms 310 to position the inner and outer members 304, 306 with respect to each other while providing the gap 308 therebetween, the stiffener assembly 350 is strongly mechanically coupled (thereby facilitating stiffening of a substrate or probe card assembly in which the stiffener assembly 350 is being used), and at the same time loosely thermally coupled (thereby facilitating reduced heat ramp-up, or soak, times required to reach steady state prior to testing).

In some embodiments, the alignment mechanism 310 may comprise a protrusion extending from one of the inner or outer members 304, 306 that interfaces with a recess formed in the other of the inner or outer members 304, 306, and an actuator for controlling the relative distance between the inner and outer members 304, 306 at the location of the alignment mechanism 310. For example, in the illustrative embodiments best shown in FIGS. 3A and 4B, a protrusion 312 extends from the inner member 304 into a recess 412 provided in the outer member 306. The protrusion 312 and the recess 412 are sized to maintain the gap 308 between the inner and outer members 304, 306. An actuator 314 extends between the inner and outer members 304, 306 and may be used to selectively control the distance therebetween, thereby selectively controlling the relative positions of the inner and outer members 304, 306. In combination with other alignment mechanisms 310 disposed about the stiffener assembly 310, the alignment mechanisms 310 may control the planar alignment between the inner and outer members 304, 306, thereby advantageously controlling the planar alignment of the probe substrates 402 while maintaining rigid support of the substrate 302. In some embodiments, the actuator 314 may be a screw, such as a set screw. Alternatively, other actuatable mechanisms may be utilized.

In some embodiments, a plurality of lateral alignment mechanisms 316 may be provided to facilitate lateral alignment of the inner and outer members 304, 306 and/or provide additional transfer of forces from the inner member 304 to the outer member 306. In the embodiment depicted in FIG. 3A, six such lateral alignment mechanisms 316 are provided. It is contemplated that greater or fewer lateral alignment mechanisms 316 may be provided. In some embodiments, the lateral alignment mechanism 316 may comprise a protrusion 318 extending into a recess similarly described above with respect to alignment mechanism 310. Optionally, an actuatable mechanism 320, such as a set screw, may further be provided to assist in restricting lateral movement and/or deflection of the inner member 304 with respect to the outer member 306. The actuatable mechanism 320 provides minimal additional points of conductive thermal transfer between the inner and outer members 304, 306, thereby maintaining the low rate of conductive thermal transfer therebetween.

Optionally, one or more flexures 322 may be provided for upwardly biasing the inner member 304 with respect to the outer member 306. The flexures 322 may additionally provide additional x-y rigidity to the stiffener assembly 350 as well as z-compliance. The flexures 322 provide low conductive thermal transfer rates between the inner and outer members 304, 306, due to the small cross sectional area of the flexure, thereby maintaining the low rate of conductive thermal transfer between the inner and outer members 304, 306. The heat transfer between the stiffener members may be further controlled by selection of the material properties of the flexures 322. Although three flexures 322 are shown in FIG. 3, greater or fewer flexures may be provided. Furthermore, although the flexures 322 are illustrated generally as rectangular (as viewed looking toward FIG. 3), they could be other shapes as well.

Thus, a thermal barrier and a probe card assembly incorporating the same for use in testing DUTs have been provided herein. The thermal barrier restricts any effects that tester side boundary conditions may have on the probe card assembly, thereby advantageously providing reduced heat ramp-up (or soak) times as well as facilitating greater control over the thermal profile of the probe card assembly, and thereby reducing the risk of unreliable connections or breaks in the connections between the resilient contact elements of the probe card assembly and the terminal of the DUT being tested.

While the foregoing is directed to embodiments of the present invention, other and further embodiments of the invention may be devised without departing from the basic scope thereof, and the scope thereof is determined by the claims that follow.

The invention claimed is:

1. An assembly for testing semiconductor devices, comprising:
   a probe card assembly comprising a stiffener assembly, wherein a portion of the stiffener assembly has a high thermal conductivity; and
   a thermal barrier disposed proximate an upper surface of the probe card assembly and positioned to restrict thermal transfer between tester side boundary conditions and the high thermal conductivity portion of the stiffener assembly.

2. The assembly of claim 1, wherein the thermal barrier comprises a material having a low heat conductivity.

3. The assembly of claim 2, wherein the thermal barrier comprises plastic.

4. The assembly of claim 1, wherein the thermal barrier further comprises:
   a plurality of holes formed therethrough and configured to allow access to portions of the stiffener.

5. The assembly of claim 1, wherein a size of the thermal barrier corresponds to a size of a probe substrate disposed in a lower portion of the probe card assembly.

6. The assembly of claim 1, wherein the thermal barrier completely covers the probe card assembly except for one or more openings, wherein the openings are sized to not substantially denigrate the thermal functionality of the thermal barrier.

7. The assembly of claim 1, wherein the high thermal conductivity portion of the stiffener is centrally disposed relative to a low thermal conductivity portion of the stiffener.

8. The assembly of claim 1, wherein a size of the thermal barrier is substantially equal to a size of a probe substrate disposed in a lower portion of the probe card assembly.

9. An assembly for testing semiconductor devices, comprising: a probe card assembly, wherein the probe card assembly comprises a high thermal conductivity stiffener centrally disposed relative to a low thermal conductivity substrate; and a cap disposed above an upper central surface of the probe card assembly, the cap providing a thermal barrier between tester side boundary conditions and portions of the probe card assembly disposed beneath the cap, wherein the cap substantially covers the probe card assembly.

10. The assembly of claim 9, wherein the cap comprises a material having a low heat conductivity.

11. The assembly of claim 9, wherein the cap comprises plastic.

12. The assembly of claim 9, wherein the probe card assembly further comprises a substrate and a stiffener for restricting flex of the substrate and wherein the cap is disposed above the stiffener.

13. The assembly of claim 12, wherein the thermal barrier further comprises:
    a plurality of holes formed therethrough and configured to allow access to portions of the stiffener.

14. The assembly of claim 9, wherein a size of the cap corresponds to a size of a probe substrate disposed in a lower portion of the probe card assembly.

15. The assembly of claim 9, wherein the cap is disposed on the upper central surface of the probe card assembly.

16. The assembly of claim 9, wherein the probe card assembly comprises:
    at least one wiring substrate for supporting and routing signals from a plurality of contact elements disposed beneath the wiring substrate to a tester, wherein the cap is disposed above a central portion of the at least one wiring substrate.

17. The assembly of claim 9, wherein the cap completely covers the probe card assembly except for one or more openings, wherein the openings are sized to not substantially denigrate the thermal functionality of the cap.

18. The assembly of claim 9, wherein a size of the cap is substantially equal to a size of a probe substrate disposed in a lower portion of the probe card assembly.

19. A probe card assembly, comprising: a wiring substrate having a tester side surface, an opposing wafer side surface, and a plurality of through holes extending therebetween wherein the wiring substrate has a low thermal conductivity; a support structure attached to the tester side surface of the wiring substrate and having portions extending into the through holes, wherein the support structure has a high thermal conductivity, and is centrally disposed relative to the wiring substrate; a probe substrate located proximate to the wafer side surface of the wiring substrate and attached to the support structure; and a cap disposed on an upper surface of the support structure, the cap providing a thermal barrier between tester side boundary conditions and portions of the probe card assembly disposed beneath the cap, wherein the cap substantially covers the support structure.

20. The assembly of claim 19, wherein the cap comprises a material having a low heat conductivity.

21. The assembly of claim 20, wherein the cap comprises plastic.

22. The assembly of claim 19, wherein the cap further comprises:
    a plurality of holes formed therethrough and configured to allow access to portions of the support structure.

23. The assembly of claim 19, wherein a size of the cap corresponds to a size of the probe substrate.

24. The assembly of claim 19, wherein a size of the cap is substantially equal to a size of the probe substrate.

* * * * *